(12) United States Patent
Emoto

(10) Patent No.: US 7,982,849 B2
(45) Date of Patent: Jul. 19, 2011

(54) EXPOSURE APPARATUS

(75) Inventor: Keiji Emoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 532 days.

(21) Appl. No.: 12/129,273

(22) Filed: May 29, 2008

(65) Prior Publication Data

US 2009/0135383 A1    May 28, 2009

(30) Foreign Application Priority Data

Jun. 12, 2007 (JP) ................. 2007-155376

(51) Int. Cl.
*G03B 27/52* (2006.01)
*G03B 27/42* (2006.01)
*G03B 27/58* (2006.01)
*G03B 27/60* (2006.01)

(52) U.S. Cl. ............... 355/30; 355/53; 355/72; 355/73

(58) Field of Classification Search ............ 355/30, 355/52, 53, 55, 72–74, 77; 356/450, 496, 356/508, 509, 399–401; 250/492.1, 492.2, 250/492.22

See application file for complete search history.

(56) References Cited

U.S. PATENT DOCUMENTS

| | | | | |
|---|---|---|---|---|
| 4,814,625 A * | 3/1989 | Yabu | ............................. | 250/548 |
| 5,134,436 A * | 7/1992 | Fujioka | ............................. | 355/30 |
| 5,141,318 A * | 8/1992 | Miyazaki et al. | ............. | 356/500 |
| 5,469,260 A * | 11/1995 | Takagi et al. | ................. | 356/500 |
| 6,400,441 B1 * | 6/2002 | Nishi et al. | ...................... | 355/53 |
| 6,665,054 B2 * | 12/2003 | Inoue | .............................. | 355/77 |
| 6,922,910 B2 * | 8/2005 | Tsuji et al. | ..................... | 34/210 |
| 7,307,692 B2 | 12/2007 | Korenaga | | |
| 7,486,378 B2 * | 2/2009 | Aichi | .............................. | 355/30 |
| 2001/0006422 A1 * | 7/2001 | Fukagawa et al. | ............ | 356/500 |
| 2001/0015795 A1 * | 8/2001 | Nishi | .............................. | 355/53 |
| 2001/0055117 A1 * | 12/2001 | Mizutani | ...................... | 356/401 |
| 2002/0015140 A1 * | 2/2002 | Yoda | .............................. | 355/53 |
| 2003/0025889 A1 * | 2/2003 | Hasegawa et al. | ............. | 355/30 |
| 2004/0218158 A1 * | 11/2004 | Nishi | .............................. | 355/30 |
| 2008/0151200 A1 * | 6/2008 | Takaiwa | ......................... | 355/30 |

FOREIGN PATENT DOCUMENTS

| | | |
|---|---|---|
| JP | 05-126522 A | 5/1993 |
| JP | 2000-36453 A | 2/2000 |
| JP | 2005-317916 A | 11/2005 |

* cited by examiner

*Primary Examiner* — Peter B Kim
*Assistant Examiner* — Christina Riddle
(74) *Attorney, Agent, or Firm* — Canon USA, Inc. IP Div

(57) ABSTRACT

An exposure apparatus including a moving member movable with a substrate, an interferometer configured to measure a position of the moving member, a blower device for blowing temperature-conditioned air, a plurality of supply openings communicating with the blower device, and a flow rate adjusting device configured to adjust a gas flow rate blown through the plurality of supply openings based on an operation of the moving member.

10 Claims, 15 Drawing Sheets

FIG.4

|  | EXPOSURE OPERATION REGION | MEASUREMENT OPERATION REGION |
|---|---|---|
| COEFFICIENT AS TO POSITIONING ACCURACY REQUIRED FOR EXPOSURE PROCESS | J | L |
| COEFFICIENT AS TO EFFECT ON AIR CONDITIONING GIVEN BY EXPOSURE PROCESS | K | M |

FIG.5

| EXPOSURE PROCESS | POSITIONING ACCURACY COEFFICIENT OF STAGE ($J_i$, $L_j$) | COEFFICIENT OF DEGREE OF EFFECT ON AIR CONDITIONING ($K_i$, $M_j$) |
|---|---|---|
| CHANGE STAGE | 0.5 | 1.5 |
| MEASUREMENT OF REFERENCE MARK | 1.5 | 1.5 |
| SHOT EXPOSURE | 1.5 | 1 |
| WAFER CONVEYANCE | 0.5 | 0.5 |
| SHOT ALIGNMENT | 1 | 1.5 |
| MEASUREMENT OF WAFER SURFACE SHAPE | 1 | 1 |

FIG.6

| EXPOSURE OPERATION REGION | | MEASUREMENT OPERATION REGION | | AIR CONDITIONING COEFFICIENT RATIO (1) | AIR CONDITIONING COEFFICIENT RATIO (2) |
|---|---|---|---|---|---|
| EXPOSURE PROCESS | AIR CONDITIONING COEFFICIENT F1 | EXPOSURE PROCESS | AIR CONDITIONING COEFFICIENT F2 | F1/F2 | F2/F1 |
| CHANGE STAGE | 1.13 | CHANGE STAGE | 0.38 | 3.0 | 0.3 |
| REFERENCE MARK | 2.25 | WAFER CONVEYANCE | 0.38 | 5.9 | 0.2 |
| SHOT EXPOSURE | 0.75 | REFERENCE MARK | 1.50 | 0.5 | 2.0 |
| | | SHOT ALIGNMENT | 1.50 | 0.5 | 2.0 |
| | | MEASUREMENT OF WAFER SURFACE SHAPE | 0.50 | 1.5 | 0.7 |
| CHANGE STAGE | 1.13 | CHANGE STAGE | 0.38 | 3.0 | 0.3 |

FIG.7

| RELATIONSHIP BETWEEN AIR CONDITIONING COEFFICIENTS | METHOD OF ADJUSTING AIR CONDITIONING |
|---|---|
| F1/F2 > 2 | DECREASE OF GAS FLOW RATE OF MEASUREMENT OPERATION REGION & INCREASE OF GAS FLOW RATE OF EXPOSURE OPERATION REGION |
| F2/F1 > 2 | DECREASE OF GAS FLOW RATE OF EXPOSURE OPERATION REGION & INCREASE OF GAS FLOW RATE OF MEASUREMENT OPERATION REGION |
| OTHERS | NORMAL CONDITION OF AIR CONDITIONING |

EXPOSURE APPARATUS

BACKGROUND OF THE INVENTION

1. Field of the Invention

The present invention relates to an exposure apparatus for exposing a substrate using a plurality of stages under a projection optical system. More specifically, the present invention relates to an air conditioning of the exposure apparatus.

2. Description of the Related Art

A projection exposure apparatus for exposing a circuit pattern drawn on a reticle (mask) onto a substrate by means of a projection optical system has conventionally been used, and recently, there is an increasing demand for the exposure apparatus of higher resolution and more economical. Therefore, the exposure apparatus capable of performing an exposure process onto an increased number of substrates in a unit of time, namely, the exposure apparatus having better productivity is required. In order to respond to such a demand, a system for an exposure apparatus is discussed by Japanese Patent Application Laid-Open No. 2005-317916. That is, the exposure apparatus performs a conveyance operation for replacing a substrate by using another stage, and various measurement operations as to the substrate at the same time while the exposure apparatus is performing exposure of the substrate and adjusting a position with a stage under the projection optical system. After all operations end, the stage arranged under the projection optically system moves to a measurement operation region for performing a conveyance operation and a substrate measurement operation, and the stage arranged in the measurement operation region further moves to an exposure operation region for performing the exposure operation.

A position measurement of the stage in the exposure apparatus has been performed normally by using an interferometric length measuring device. The interferometric length measuring device is frequently used in a position measurement of a stage that requires a high-accuracy orientation control because the interferometric length measuring device has a high resolution function. On the other hand, the interferometric length measuring device tends to cause a measurement error due to an environmental change around a light path. Therefore, the more the high-accuracy measurement is required, the more the environmental change around the light path needs to be suppressed or the more a compensation technique is required. Examples of well-known factors of the measurement error due to the environmental change include a temperature change, a humidity change, and a pressure (barometric pressure and sound pressure) change. A change of ratio of components of air may cause the measurement error according to the circumstances. When an operator tries to measure a position of a stage by using the interferometric length measuring device within the exposure apparatus with a precision equal to or less than 1 nm, it is required to suppress the environmental change around the interferometer light path to a degree of a temperature of $1/1,000°$ C., a humidity of 0.1%, and a pressure of 1 Pa, or to perform a certain kind of real time compensation.

On the other hand, the stage within the exposure apparatus includes a heat source such as an exposure heat generated by an irradiation with exposure light, various actuators and sensors, and the like, and thus a temperature change of 0.01° C. level will occur on a stage surface even if cooling processing is performed on the stage surface. Therefore, in addition to a simple blowing of the high accuracy air conditioning to a region around the interferometer light path, various techniques have been discussed for the exposure apparatus so that an environmental change is suppressed as much as possible. For example, according to Japanese Patent Application Laid-Open Publication No. 05-126522, by changing a configuration of an air conditioning blow unit according to movement of the stage, the highly accurately temperature-controlled air conditioning is blown to only a vicinity of a measuring beam. Further, Japanese Patent Application Laid-Open Publication No. 2000-36453 discusses such a system that a flow balance of the supply opening is changed according to a position of the stage in order to give a constant temperature-regulated air flow to the stage disregarding the position of the stage.

However, in Japanese Patent Application Laid-Open Publication Nos. 05-126522 and 2000-36453, an air conditioning is performed based only on positional information of the stage, and it is difficult to achieve an efficient air conditioning by this method. This is because a disturbance of air conditioning depends to a large degree on a movement operation (hereinafter referred to as the "operation"), so that it is necessary to consider the movement of the stage in order to achieve the efficient air conditioning.

Generally, when a stage is moved in a larger stroke, the air conditioning around the interferometer light path tends to be disturbed, as compared to stage movement in a smaller stroke. For example, an exposure apparatus in which an exposure operation region and a measurement operation region are independently provided as discussed in Japanese Patent Application Laid-Open Publication No. 2005-317916, disturbance of the air conditioning due to the stroke of the stage movement appears more markedly.

Even if the stage is not moved in a large stroke, when a stage operation requiring a high accuracy positioning needs to be performed, it is necessary that the air conditioning around the interferometer light path is not disturbed as much as possible.

If the air conditioning is performed without taking into consideration a degree of disturbance of the air conditioning caused by the stage operation or the air conditioning accuracy required by the stage operation, a next task cannot be taken before the air conditioning comes to be desired one. Thus, throughput is decreased.

SUMMARY OF THE INVENTION

The present invention provides an exposure apparatus in which an air conditioning of an interferometer light path becomes stable as soon as possible and thus can improve productivity or an exposure accuracy.

According to a first aspect of the present invention, an exposure apparatus includes a moving member movable with a substrate, an interferometer configured to measure a position of the moving member, a blower device for blowing temperature-conditioned air, a plurality of supply openings communicating with the blower device; and a flow rate adjusting device configured to adjust a gas flow rate blown from the plurality of supply openings based on an operation of the moving member.

According to a second aspect of the present invention, an exposure apparatus includes a projection optical system configured to project a pattern of an original plate onto a substrate, a measurement optical system configured to measure a surface position or a surface shape of the substrate, a moving member configured to hold the substrate, a first interferometer configured to measure a position of the moving member positioned in an optical path of one of the projection optical system and the measurement optical system, a blower device for blowing temperature-conditioned air, a first supply opening, communicating with the blower device, for providing air conditioning to a light path of measurement light falling onto the moving member from the first interferometer, a second supply opening, communicating with the blower device, for providing air conditioning to a region other than the light path of the measurement light, and a flow rate adjusting device configured to adjust the flow rate and supply the air blown from the blower device to the first supply opening and the second supply opening, respectively, based on the operation of the moving member.

According to a third aspect of the present invention, the exposure apparatus includes a projection optical system configured to project a pattern of an original plate onto a substrate, a measurement optical system configured to measure a surface position or a surface shape of the substrate, a first region for projecting the pattern of the original plate onto the substrate by the projection optical system, a second region for measuring a surface position or a surface shape of the substrate by the measurement optical system, a plurality of moving members movable between the first region and the second region, a first interferometer configured to measure a position of the moving member positioned in the optical path of the projection optical system among the plurality of moving members, a second interferometer configured to measure a position of the moving member positioned in the optical path of the measurement optical system among the plurality of moving members, a blower device for blowing temperature-conditioned air, a first supply opening, communicating with the blower device, for providing air conditioning of the first region, a second supply opening, communicating with the blower device, for providing air conditioning of the second region, and a flow rate adjusting device configured to adjust a flow rate and supply the air blown from the blower device to the first supply opening and the second supply opening, respectively, based on the operation of the moving member.

According to a fourth aspect of the present invention, an exposure apparatus includes a projection optical system configured to project a pattern of an original plate onto a substrate, a measurement optical system configured to measure a surface position or a surface shape of the substrate, a moving member movable with the substrate, a first interferometer configured to measure a position of the moving member positioned in an optical path of one of the projection optical system and the measurement optical system, a blower device for blowing temperature-conditioned air, a first supply opening, communicating with the blower device, for providing air conditioning to a light path of measurement light falling onto the moving member from the first interferometer, a second supply opening, communicating with the blower device, for providing air conditioning to a region other than the light path of the measurement light, and a flow rate adjusting device configured to adjust the flow rate and supply the air blown from the blower device to the first supply opening and the second supply opening, respectively, based on the an exposure process.

According to a fifth aspect of the present invention, a method of manufacturing a device includes exposing the substrate to a pattern by using an exposure apparatus with a moving member movable with a substrate, an interferometer for measuring a position of the moving member, a blower device for blowing temperature-conditioned air, a plurality of supply openings communicating with the blower device, a flow rate adjusting device for adjusting an gas flow rate blown from the plurality of supply openings based on an operation of the moving member, and developing the exposed substrate.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 4 illustrates a definition of coefficient corresponding to the exposure process.

FIG. 5 illustrates an example of coefficient with regard to an air conditioning accuracy and a degree of effect on the air conditioning necessary in each of the exposure processes.

FIG. 6 illustrates a result of calculation based on an assessment function with regard to each of the exposure processes.

FIG. 7 illustrates a method of adjusting the air conditioning based on the calculation result obtained by the assessment function.

DETAILED DESCRIPTION OF THE EMBODIMENTS

Various exemplary embodiments, features, and aspects of the invention will be described in detail below with reference to the drawings.

Figure 15:
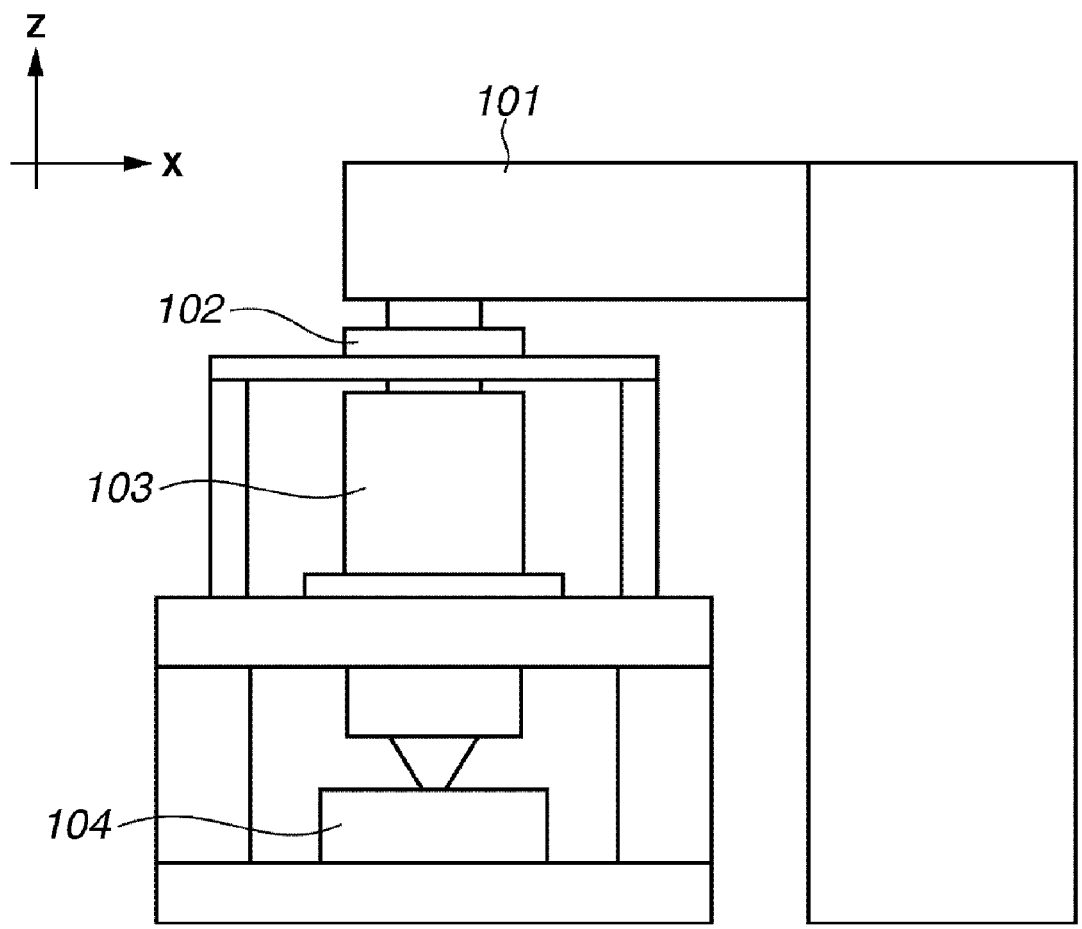
FIG. 15 illustrates the exposure apparatus according to the exemplary embodiments of the present invention.

Now, an example configuration of an exposure apparatus according to exemplary embodiments of the present invention will be described below. The exposure apparatus includes, as shown in FIG. 15, a light source 101; a reticle stage 102 with reticle; a projection optical system 103; and a wafer stage 104 including a wafer. The exposure apparatus is configured to perform a projection exposure of a circuit pattern formed on the reticle onto the wafer. The exposure apparatus may be a step-and-repeat projection exposure type apparatus or a step-and-scan projection exposure type apparatus.

The light source 101 illuminates the reticle on which the circuit pattern is formed and includes a light source unit and an illumination optical system. The light source unit uses as a light source, for example, a laser. Examples of the laser include an ArF excimer laser of about 193 nm wave length, KrF excimer laser of about 248 nm wave length, and F2 excimer laser of about 153 nm wave length. The laser to be used is not limited to the excimer laser but may be, for example, a YAG laser. Moreover, any number of lasers may be used. When the laser is used as the light source, a light flux shaping optical system that shapes a parallel luminous flux emitted from the laser light source into a preferred beam shape, and an incoherent optical system that converts a coherent laser flux into an incoherent laser flux can be used. Furthermore, the light source to be used is not limited to the laser but one or more lamps such as mercury lamps or xenon lamps may be used.

The illumination optical system is an optical system for illuminating a mask and thus includes a lens, a mirror, a light integrator, a diaphragm, and the like.

The projection optical system 103 used here may be an optical system including only a plurality of lens elements, an optical system including a plurality of lens elements and at least one concave mirror (catadioptric optical system), an optical system including a plurality of lens elements and at least one diffractive optical element such as a kinoform, an entire mirror type optical system, or the like.

A reticle stage 102 and a wafer stage 104 are movable by, for example, a linear motor. In a case of the step-and-scan projection exposure type apparatus, the respective stages are synchronized with each other in movement. Further, an independent actuator is provided in at least one of the wafer stage or the reticle stage in order to position the pattern on the reticle onto the wafer.

The above described exposure apparatus can be used in manufacturing a semiconductor device such as a semiconductor integrated circuit, a micro machine, and a device on which a minute pattern is formed such as a thin film magnetic head.

First Exemplary Embodiment

Now, an example exposure apparatus according to a first exemplary embodiment of the present invention will be described below in detail with reference to FIGS. 1 to 3. A stage operation in the present specification includes not only a movement operation of the stage but also a stage speed or the like.

Figure 1:
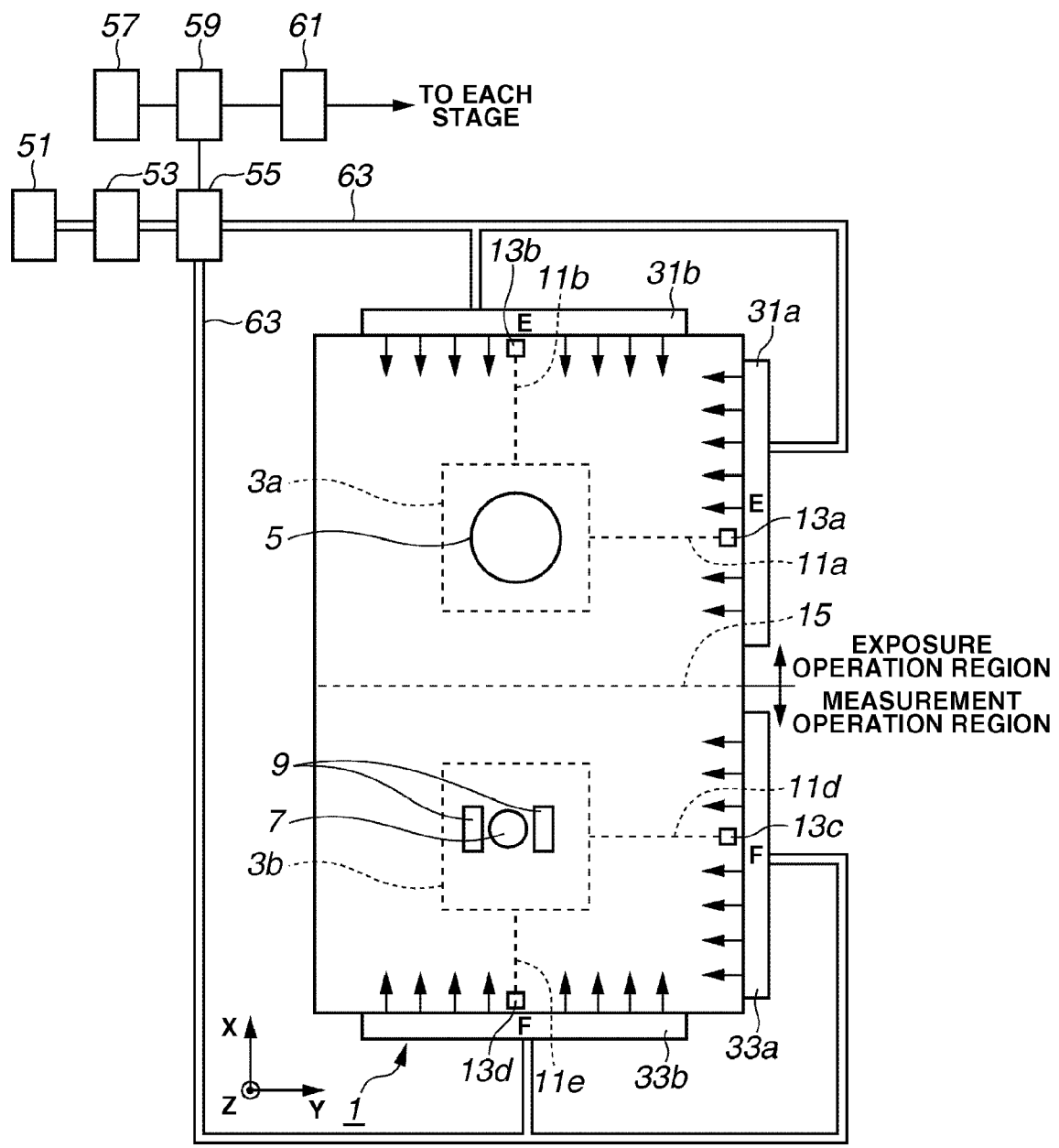
FIG. 1 illustrates a relationship between a stage system within an exposure apparatus and an air conditioning supply opening according to a first exemplary embodiment of the present invention.

FIG. 1 illustrates an example of a configuration of an exposure apparatus 1 according to the first exemplary embodiment. The exposure apparatus 1 has an exposure operation region for performing an exposure process, in which a pattern of a reticle (original plate) is projected to expose and irradiate a wafer (substrate) held on a stage 3a with the pattern while the stage 3a (moving member) is moved locating a position under a projection optical system 5 (an upper side of FIG. 1).

An interferometric length measuring devices 13a and 13b perform a position measurement of the stage 3a positioned in an optical path of the projection optical system 5. The position measurement of the stage 3a is performed by detecting a change of an optical length of measurement light. Here, the stage 3a positioned in the optical path of the projection optical system 5 means a state that light falling from the projection optical system 5 and the stage 3a cross with each other.

A measurement optical system mainly includes an alignment optical system 7 and a focus optical system 9, and is provided with a measurement operation region for performing a surface position measurement of a wafer held on the stage 3b below the measurement optical system (shot position measurement within a wafer or the like) and a surface shape measurement of the wafer (lower side of FIG. 1) in addition to an exposure operation region. The measurement operation region is provided with a wafer conveyance system (not shown) arranged therein which performs a wafer conveyance process in which an exposed wafer is conveyed to an outside of the apparatus and a new wafer before exposure is placed onto the stage 3b. The measurement operation region is also provided with an interferometric length measuring devices 13c and 13d arranged therein. The interferometric length measuring devices 13c and 13d performs a positional measurement of the stage 3b positioned in the optical path of the measurement optical system. Similar to the above-mentions, the stage 3b positioned in the optical path of the measurement optical system means a state that the light falling from the measurement optical system and the stage 3b cross with each other. The exposure operation region and the measurement operation region are provided with air conditioning supply openings 31a, 31b and 33a, 33b, respectively. The air conditioning supply openings 31a, 31b and 33a, 33b blow highly accurate temperature-controlled and humidity-controlled gas in order to suppress a temperature change in an ambient area of the interferometer light paths 11a, 11b, 11d and 11e. As above described, the air conditioning supply according to the exemplary embodiment of the present invention can supply not only air but also gas. Further, "air" of the "air conditioning" in the exemplary embodiment of the present invention is not limited to air but includes gas. Reference numeral 15 indicates a boundary between the exposure operation region and the measurement operation region. Air conditioning of the exposure operation region is performed by blowing gas from the air conditioning supply openings (31a and 31b) indicated by E in FIG. 1. Further, air conditioning of the measurement operation region is performed by blowing air from the air conditioning supply openings (33a and 33b) indicated by F in FIG. 1. According to the present exemplary embodiment, air is mainly blown in a direction parallel to each of the interferometer light path directions.

The temperature and humidity of the air from an air blower 51 is adjusted with a high accuracy by a temperature adjustment device 53. Then, an air distribution amount between the air conditioning supply openings E and the air conditioning supply openings F is adjusted by a flow rate adjusting device 55. The distributed air is blown out from each of the air conditioning supply openings 31a, 31b, 33a and 33b communicating through a fan duct 63. As shown in FIG. 3 in more detail, the main control device 57 controls an entire exposure apparatus, and an exposure process control device 59 performs a sequence of the next exposure process based on the output signal of the main control device 57. According to the output sequence of the exposure process, a stage control device 61 controls the stage to perform a stage operation corresponding to each of the exposure processes. The flow rate adjusting device 55 determines a flow rate of each air conditioning based on the output from the exposure process control device 59.

Figure 2:
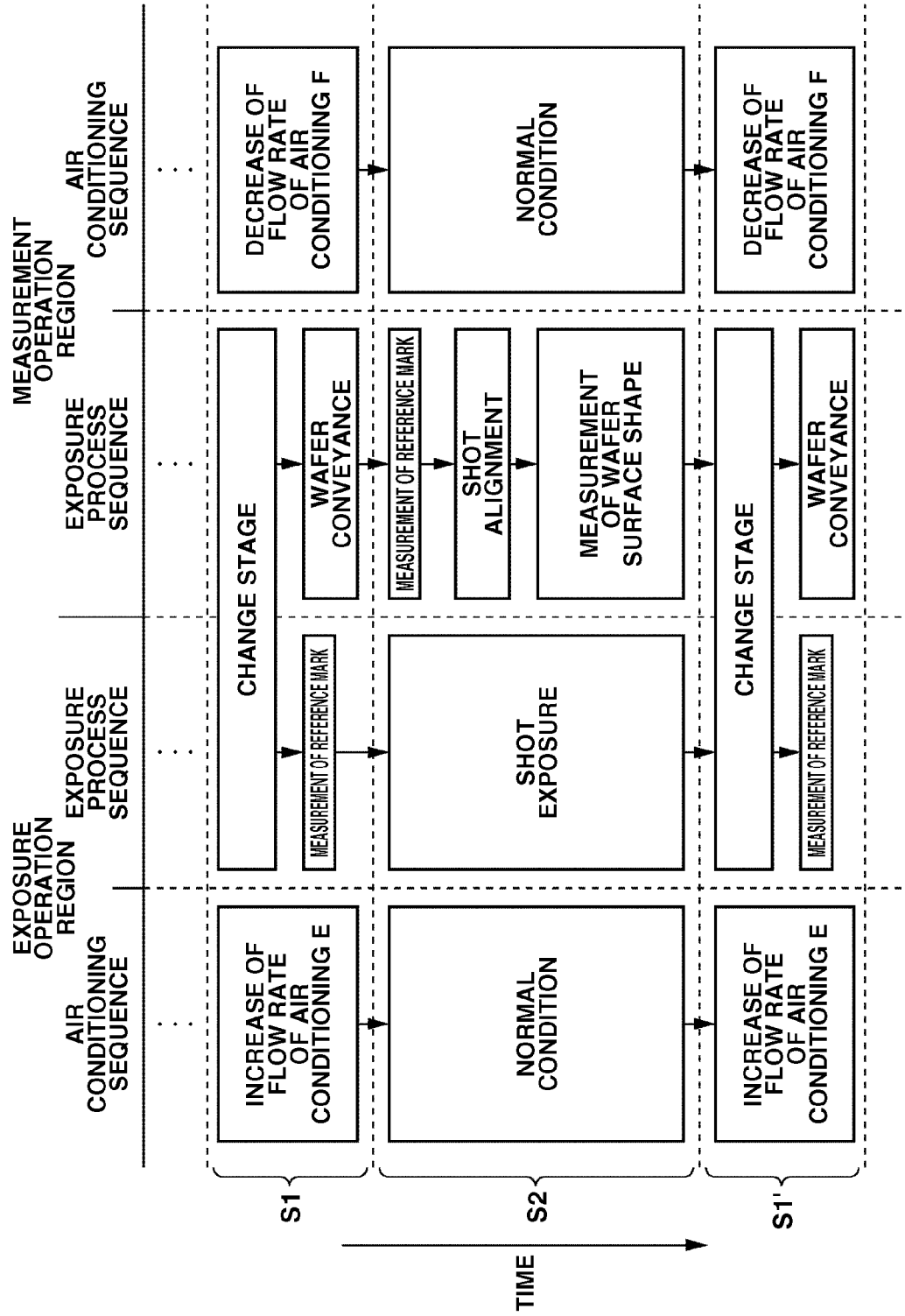
FIG. 2 illustrates a time-sequential relationship between an exposure process and an adjustment condition of an air conditioning according to the first exemplary embodiment of the present invention.
Figure 3:
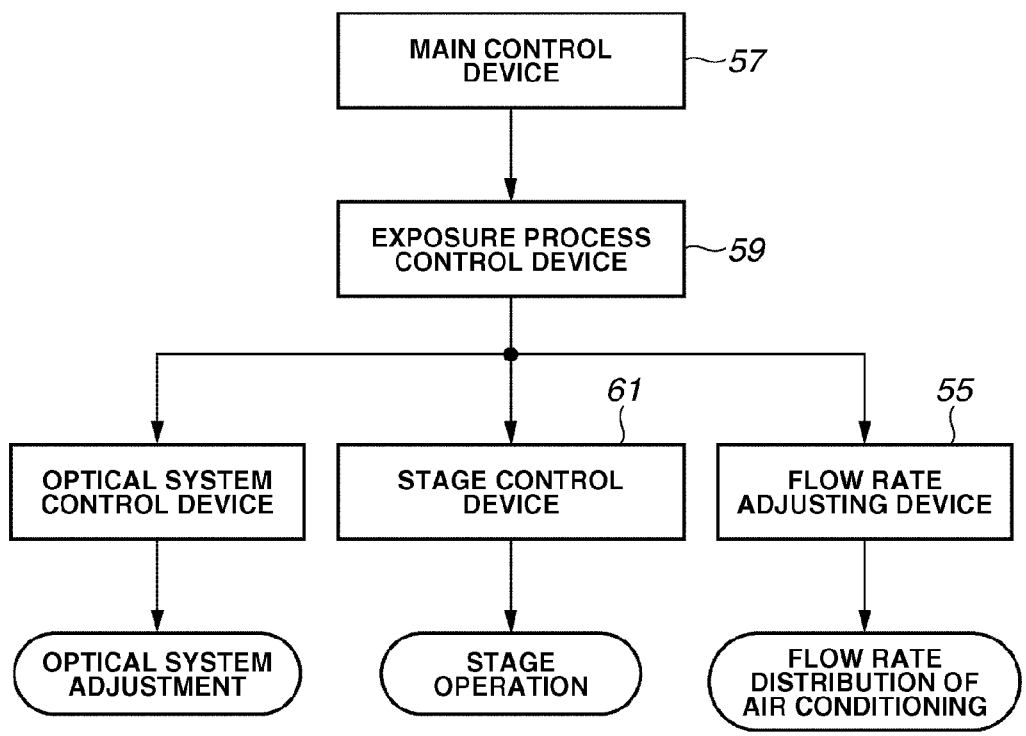
FIG. 3 illustrates how a main control device and each of controllers are connected through information.

FIG. 2 illustrates a portion extracted from a series of sequences as to a relationship between a time-sequential exposure process and an air conditioning sequence according to the exemplary embodiment of the present invention. The exposure process of FIG. 2 includes two operation regions (i.e., an exposure operation region and a measurement operation region) similar to the exposure process of FIG. 1, and it is assumed that in such an exposure apparatus, each of two stages performs a predetermined exposure process in each of the operation regions. The two stages are movable throughout the operation regions. Since the exposure process is named in various ways, a definition of each exposure process according to the present exemplary embodiment will be described briefly below.

A stage exchange process is a process of replacing a stage moving under the projection optical system with the other stage, after the stage performed the exposure process in each operation region. For example, as shown in FIG. 1, a state that the stage 3a performs a moving operation within the exposure operation region and that the stage 3b performs a moving operation within the measurement operation region is referred to as a state A. A state that the stage 3a performs a moving operation within the measurement operation and that the stage 3b performs a moving operation within the exposure operation region is referred to as a state B. In this case, a stage exchange process can be defined as a stage movement process that changes from the state A to the state B or from the state B to the state A.

A reference mark measurement process is a process that measures a reference mark provided on the stage. In the reference mark measurement process, a position between the reticle and the wafer is adjusted in the exposure operation region, and a position between the alignment optical system and the wafer is adjusted in the measurement operation region, respectively.

A shot exposure process is a process of exposure-transferring a pattern of the reticle onto each of the plurality of exposure shots in the wafer while the stage is moved.

A wafer conveyance process is a process of taking out the wafer subjected to the above shot exposure process and placing a new wafer to be subjected to the shot exposure process onto the stage.

A shot alignment process is a process in which an alignment mark provided on a wafer is measured by an alignment optical system to grasp a positional relationship between exposure shots, and acquire information for adjusting a position between each exposure shot and the reticle.

A wafer surface shape measurement process is a process of measuring a concave and convex shape of a surface of the wafer using a focus optical system in order to adjust a focus at the time of a shot exposure.

The main exposure processes relating to an exposure operation within the exposure apparatus are as described above; however, there are other additional exposure processes that perform high accuracy exposure or result from a difference of a exposure apparatus system. Moreover, each exposure process as described herein may be referred to with the other exposure process name when the functions are divided. Alternatively, an exposure process including an additional function other than the one described herein may have a similar name. However, in the exemplary embodiment of the present invention, a strict definition of each exposure process is meaningless. As will be described below, what is important is to grasp a positional accuracy of necessary stage and a movement of the stage in view of an effect on air conditioning accuracy and to grasp in what order each exposure process is performed.

FIG. 4 is a table defining variable names (J, K, L, M) in the exposure operation region and the measurement operation region with regard to a coefficient representing the positional accuracy of the stage required by the exposure process and a coefficient representing a degree of effect of the stage operation on the air conditioning in the exposure process. FIG. 5 shows a value of each coefficient defined in FIG. 4 as an example for each corresponding exposure process. In each exposure process, J and L are set to values larger than one (with reference to a value one) when stage positioning with a higher accuracy is required, while J and L are set to values smaller than one when positioning with only relatively lower accuracy is required. Further, K and M are set to values larger than one (with reference to a value one) when air conditioning around the interferometer light path tends to be disturbed due to the stage operation (in which an air conditioning temperature accuracy tends to be deteriorated), whereas K and M are set to values smaller than one when an effect on the air conditioning is relatively low. As a matter of course, the above values are not absolute values but can be obtained based on an experimental value or a certain reference value. As such, a different value may be obtained depending on how the coefficient is decided even when the similar exposure process is performed. Further, the values may greatly differ depending on an exposure system. For example, with regard to the reference mark measurement process, when a plurality of reference mark regions provided on the stage are measured, the value becomes "1.5", whereas when only one region is measured, the value becomes "0.5" since there is only a little stroke of the stage movement. Those coefficients are decided based on a specific analysis of each exposure process while the coefficients are checked against each exposure system.

An example of a method for deciding a coefficient will be described below. A main operation of a stage varies according to each exposure process. For example, a reciprocal motion with a shorter stroke may be a main operation. Alternatively, a reciprocal motion with a relatively longer stroke may be a main operation, or a suspended state may be maintained almost all the time. Typically, with regard to the movement of the stage, as the stroke becomes longer or as a speed of movement becomes higher, air around the stage tends to be easily disturbed and thus degrade an air conditioning accuracy. In view of productivity, the movement of the stage within the exposure apparatus is set to as high speed as possible. Accordingly, a degree of disturbed air conditioning can be presumed by a main stroke of the movement of the stage in most cases. As a matter of course, since various factors are related to each other in actual cases, the degree of disturbed air conditioning is not presumed only by the stroke and the speed of the stage movement. Therefore, the degree of disturbed air conditioning may be presumed by a combination of the stroke, the speed, a position of the stage, and the like with reference to a preliminary evaluation of disturbed air conditioning.

According to the embodiment of the present invention, it is necessary to grasp an order of performing each exposure process based on a characteristic of each exposure process in consideration of the above-described viewpoints. This is because it is necessary to consider a time lag for returning a space that has once lost a normal air conditioning accuracy to the space having a high accuracy air conditioning. For example, it is assumed that there is an exposure process which further degrades the air conditioning accuracy (exposure process in which K or M is larger than one in FIG. 5) and that the next exposure process is an exposure process requiring a high accuracy air conditioning (exposure process in which J or L is larger than one in FIG. 5). In this case, it takes a certain time period in order to return the space once having lost the normal air conditioning accuracy in the prior exposure process to the space having a high accuracy air conditioning state. Therefore, the process cannot go forward to the next exposure process that needs a high accuracy air conditioning state. Accordingly, there may be a case where an idling process may occur before the space returns to a high accuracy air conditioning state in such an exposure process. As a matter of course, it is desirable that the idling process which may cut into productivity of the exposure apparatus is to be eliminated as much as possible or is to be set to the shortest possible time period. On the other hand, if exposure processes which do not require a high accuracy air conditioning follow immediately after the exposure process that deteriorates the air conditioning accuracy, there is a relatively low requirement to return the space to a high accuracy air conditioning after an end of the prior exposure process.

As described above, the movement of the stage in the exposure operation region, the movement of the stage in the measurement operation region, and the exposure process are compared to each other and the gas flow rate is adjusted based on the comparison result, so that a more efficient air conditioning can be achieved.

Further, the more efficient air conditioning is achieved by adjusting the air conditioning when the order of the movements of the stages and the exposure processes are taken into consideration. The movements of the stages or the exposure processes currently performed or to be performed in a next step in the exposure operation region and the measurement operation region are compared to each other to specify a air conditioning space which is given a priority based on the comparison result.

When the movements of the stages or the exposure processes in the exposure operation region and the measurement operation region is compared, information as to the gas flow rate required in each movement of the stage or each exposure process may be preliminarily stored in a memory storage unit such as a memory. Alternatively, in the case where the information is not preliminarily stored, the comparison may be performed for each movement of the stage and each process in real time. A memory, a central processing unit (CPU), and the like provided in the main control device 57 may be used to perform an arithmetic processing, or alternatively, an independent arithmetic processing unit may be provided to send a command from the arithmetic processing unit to the flow rate adjusting device 55.

Further, as an effective method for rapidly returning a space that has lost an air conditioning accuracy due to a specific exposure process to a space having a high accuracy air conditioning includes, a gas flow rate can be increased through the air conditioning supply opening. Typically, a time period in which a space that has lost to a certain degree the air conditioning accuracy returns to the space having a preferable air conditioning accuracy, inversely relates to a gas flow rate through the air conditioning supply opening. Therefore, if the gas flow rate is preliminarily set to a larger value, the exposure process can more rapidly shift from an exposure process causing a degradation of the air conditioning to an exposure process requiring a high accuracy air conditioning. However, since the gas flow rate is limited by an air conditioning functional force or the like, it is difficult to make adjustment to simply increase the gas flow rate. Generally, the air blowers 51 are not provided for air conditioning supply openings on one-on-one basis, but one air blower 51 is provided for a plurality of air conditioning supply openings in the most cases. For example, it is presumed in the present exemplary embodiment that one air blower 51 sends air to all of the air conditioning supply openings for the air conditioning spaces of the wafer stage. In this case, an entire flow rate of the air blower 51 is optimized and thus, if the entire flow rate from the air blower is changed, an optimized characteristic of the air blower may be lost. Accordingly, a balance in air conditioning is changed in a state that the entire flow rate from the air blower 51 is kept at a constant level.

Figure 8:
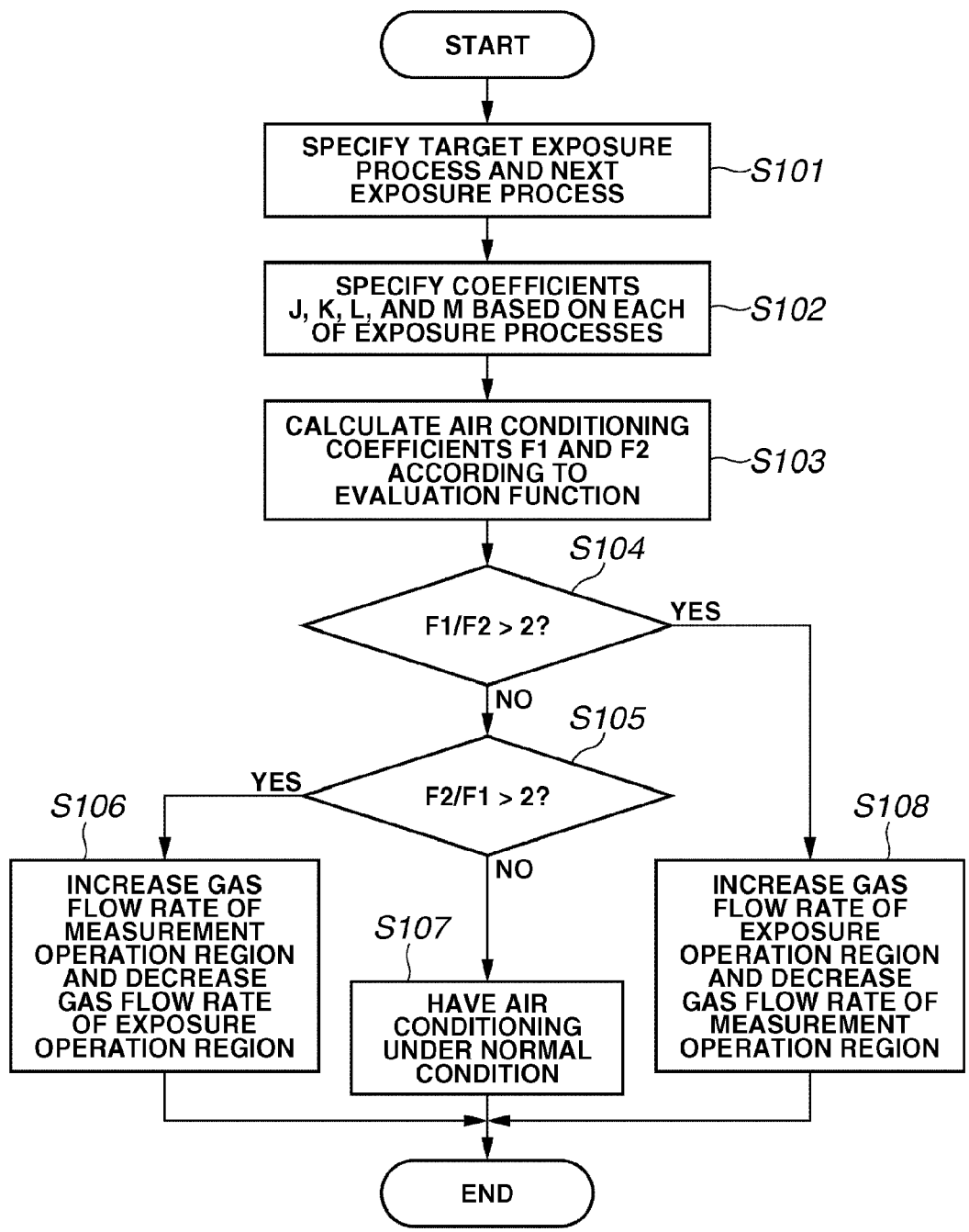
FIG. 8 is a flow chart illustrating a flow of air conditioning adjustment according to the first exemplary embodiment of the invention.

FIG. 8 illustrates the above-described ideas in the form of a flow. The assessment function for calculating air conditioning coefficients F1 and F2 is described below.

$$F1_i = J_i \times K_i \times L_{i+1},$$

$$F2_j = M_j \times L_j \times L_{j+1}$$

$F1_i$: an air conditioning coefficient of $i^{th}$ exposure process in an exposure operation region $F2_j$: an air conditioning coefficient of $j^{th}$ exposure process in a measurement operation region A criterion for deciding an index of an air conditioning adjustment based on a relationship between the air conditioning coefficient F1 and the air conditioning coefficient F2 is defined in a table of FIG. 7.

A flow of FIG. 8 will be briefly described below. The flow rate adjusting device 55 specifies a target exposure process and the next exposure process in step S101. The flow rate adjusting device 55 specifies coefficients J, K, L and M based on each of the exposure processes in step S102. The flow rate adjusting device 55 calculates the air conditioning coefficients F1 and F2 with the assessment function in step S103. The flow rate adjusting device 55 determines whether thus calculated air conditioning coefficients F1 and F2 satisfy a predetermined relationship in steps S104 and S105. Then, the flow rate adjusting device 55 adjusts, in the following manner, the air conditioning gas flow rate according to the above result. The flow rate adjusting device 55 increases the air conditioning gas flow rate in the measurement operation region, while it decreases the air conditioning gas flow rate in the exposure operation region in step S106. The flow rate adjusting device 55 places the air conditioning gas flow rates in the measurement operation region and the exposure operation region at a normal condition in step S107. The flow rate adjusting device 55 increases the air conditioning gas flow rate in the exposure operation region, while it decreases the air conditioning gas flow rate in the exposure operation region in step S108.

In performing a calculation of the present flow, a memory, a CPU, or the like provided in the main control device 57 may be used, or an independent arithmetic processing unit may be used to send a command thereof to the flow rate adjusting device 55.

In FIG. 2, to show that a time shifts from top down in the drawing, a temporal transition of the exposure operation region and the measurement operation region are illustrated side by side such that the air conditioning adjustment states can be seen together with the temporal transition. Here, a relationship between the exposure process and the air conditioning state in each time step is described while each time step in FIG. 2 is defined as S1, S2, and S1', respectively.

In time step S1, a stage exchange process is performed between the exposure operation region and the measurement operation region, and then, a reference mark measurement process is performed in the exposure operation region and a wafer conveyance process is performed in the measurement operation region, respectively. A vertical length of a frame indicating the reference mark measurement process is shorter than a length of a frame indicating the wafer conveyance process in FIG. 2. This is because the reference mark measurement process ends within a shorter time period than the wafer conveyance process, and the process can proceed from the reference mark measurement to the next process. During time step S1, the flow rate adjusting device 55 increases the gas flow rate at air conditioning supply openings E (31a, 31b) for providing air conditioning to the space of the exposure operation region of FIG. 1. At the same time, the flow rate adjusting device 55 decreases the gas flow rate at air conditioning supply openings F (33a and 33b) for providing air conditioning to the space of the measurement operation region. As shown in FIG. 2, the stage exchange process disturbs the air conditioning which deteriorates the air conditioning accuracy. Thereafter, it is necessary in the exposure operation region to shift to a reference mark measurement process which requires a high accuracy air conditioning. On the other hand, in the measurement operation region, the process shifts to a wafer conveyance process in which the air conditioning accuracy is not important and which does not disturb the air conditioning. Therefore, even if the gas flow rate through the air conditioning supply openings F in the measurement operation region is decreased, the wafer conveyance process is not affected. Accordingly, the space may be returned to the high accuracy air conditioning within a relatively long time period before the next reference mark measurement process starts. Consequently, a flow rate of the air conditioning supply openings E of the exposure operation space is increased in which air conditioning accuracy needs to be quickly returned to the original air conditioning accuracy after the stage exchange process. On the other hand, the flow rate of the air conditioning supply openings F of the measurement operation space is decreased in which air conditioning accuracy may be relatively slowly returned to the original air conditioning accuracy. The flow rate adjusting device 55 determines and adjusts the flow rate to each supply opening in consideration of the above states. Accordingly, an optimum air conditioning balance of the exposure operation system can be realized while the entire flow rate from the air blower 51 is substantially constant. It is not necessary to always increase the gas flow rate in the exposure operation region and decrease the gas flow rate in the measurement exposure operation region in step S1. That is, at least in a part of step S1, the gas flow rate may be increased, for example, when there is a high probability that the air conditioning is disturbed by a substantial operation of the stage. The substantial operation of the stage is performed when an exposed wafer is retracted from a light axis of the projection optical system and the wafer measured by the measurement optical system is moved to the light axis of the projection optical system. Similarly, in adjusting the flow rate in a certain step, it is not necessary to set always a difference of the gas flow rate between the exposure operation region and the measurement operation region based on a degree of the air conditioning accuracy required in the process.

In time step S2, exposure processes which require a high accuracy air conditioning are performed in both of the exposure operation region and the measurement operation region. Therefore, an air conditioning balance is returned from the air conditioning where the exposure operation region has a priority, to a normal condition. The normal condition is a condition in which the spaces of the two regions are preliminarily adjusted to have about the same degree of the air conditioning accuracy. When a process goes to the next stage exchange process in time step S1', a sequence is repeated in which the flow rates of the air conditioning supply openings E and the air conditioning supply openings F are changed in a similar manner.

A concept of the air conditioning adjustment method has been described above with reference to FIG. 2. A calculation method and an adjustment method will be described below using actual figures with reference to FIGS. 5 to 8.

Time step S1 of FIG. 2, particularly an example method of adjusting the air conditioning in a stage exchange operation, will be described below in detail. With respect to an exposure process in exchanging a stage, at the same time of the exposure process, the flow rate adjusting device 55 receives also information from the exposure process control device 59 about the next exposure process to make confirmation. In the present example, the next exposure process is a reference mark measurement in the exposure operation region and a wafer conveyance in measurement operation region, respectively. Next, coefficients defined in FIG. 4 with respect to the stage exchange, the reference mark measurement, and the wafer conveyance are specified based on FIG. 5. Here, a suffix given to each of the coefficients in FIG. 5 represents a process number based on an order of the exposure processes. In other words, the suffix i given to the coefficient J represents a coefficient in an $i^{th}$ exposure process, and therefore, the suffix i+1 represents a coefficient next to the $i^{th}$ exposure process. According to the above description, the coefficients J and L in exchanging stage are 0.5, and the coefficients of K and M are 1.5. The coefficient J at the time of the reference mark measurement is 1.5, and the coefficient L at the time of the wafer conveyance is 0.5. Those values are calculated using the above assessment function to obtain the air conditioning coefficients F1 and F2, which indicate a degree of materiality of the air conditioning in each operation region. More specifically, the air conditioning coefficient F1 of the exposure operation region in exchanging the stage is obtained by 0.5× 1.5×1.5, which results in a value of about 1.13. On the other hand, the air conditioning coefficient F2 of the measurement operation region is obtained by 1.5×0.5×0.5, which results in a value of about 0.38. Subsequently, an air conditioning coefficient ratio F1/F2 or F2/F1 of the two values is calculated to perform the air conditioning adjustment based on the decision criterion in FIG. 7. In the stage exchange according to the present example, F1/F2 is 3.0, namely, F1 is considered to have a materiality three times larger than F2. An adjustment is performed such that the gas flow rate in the exposure operation region is increased while the air conditioning in the measurement operation region is decreased. How much the gas flow rate is increased or decreased may be determined based on the air conditioning coefficient ratio, or may be changed in a single uniform way, for example, by 20%.

FIG. 6 illustrates the calculation result as above-described with regard to each of the exposure processes. Cells which include the numbers of the air conditioning coefficient ratio and which are slightly marked out represent a part having the air conditioning coefficient ratio which is larger than two. More specifically, it is determined that one gas flow rate is to be increased from the normal air conditioning while the other flow rate is to be decreased from the normal air conditioning. It can be seen that the method of adjusting the air conditioning based on the above-described series of calculation results are reflected on an air conditioning sequence shown in FIG. 2. FIG. 8 illustrates a flow of adjusting the air conditioning, which corresponds to the above description.

Summary of the above description will follow.

The exposure processes performed in the exposure operation region and the measurement operation region are compared to each other, and the flow rate adjusting device 55 changes the flow rate of each supply opening, namely, changes an air conditioning balance, so as to have an optimum air conditioning. As a first aspect, the flow rate adjusting device 55 increases the gas flow rate of the exposure process requiring higher air conditioning accuracy, to which the flow rate adjusting device 55 gives higher priority than the other gas flow rates. As a second aspect, the flow rate adjusting device 55 gives priority to and increases the gas flow rate of an exposure process which needs to return to a high accuracy air conditioning before the next exposure process starts. As required, the next exposure process may be considered. As a third aspect, the flow rate adjusting device 55 gives priority to and increases the gas flow rate of the exposure process involving the stage movement which tends to deteriorate the air conditioning in consideration of a degree of the deterioration of the air conditioning due to the movement of the stage in each exposure process. The flow rate adjusting device 55 increases the flow rate of the air conditioning supply opening having a priority in view of the above aspects. On the other hand, the flow rate adjusting device 55 decreases the flow rate of the air conditioning supply opening for which the gas flow rate can be relatively decreased. The flow rate adjusting device 55 may determine the flow rate based on one of the above described aspects, or may generally determine the flow rate based on a combination of the aspects.

Second Exemplary Embodiment

Now, a second exemplary embodiment will be described below with reference to FIGS. 9 and 10. In the following description, similar components to the above described exemplary embodiment will be given the same reference numerals, and thus the description thereof will be simplified or omitted.

Figure 9:
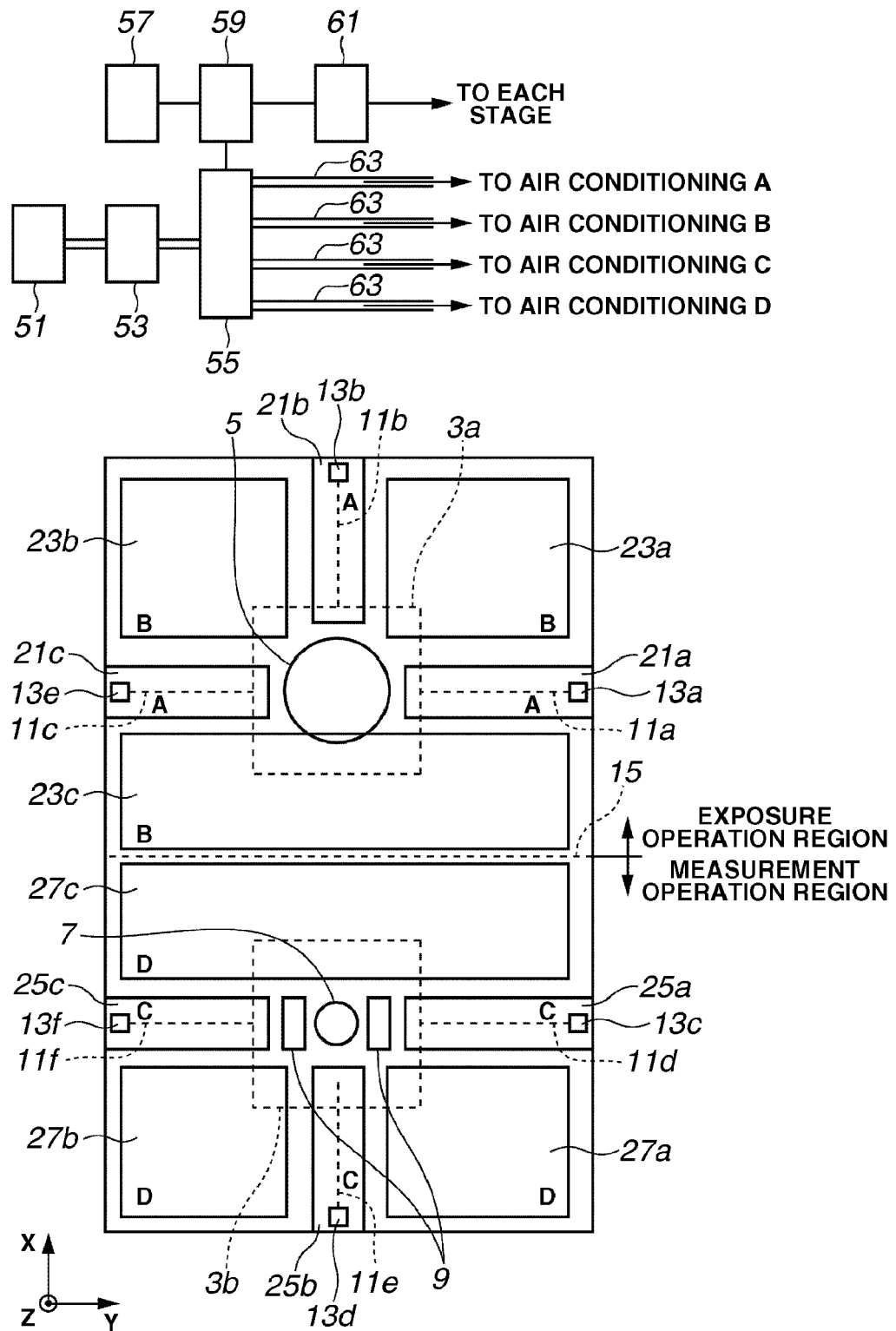
FIG. 9 illustrates a relationship between a stage system and an air conditioning supply opening within an exposure apparatus according to second to fourth exemplary embodiments of the present invention.

FIG. 9 illustrates an example of a configuration of the exposure apparatus 1 according to the second exemplary embodiment. A configuration of the stage is similar to the first exemplary embodiment except for a method for blowing the air conditioning. That is, the air conditioning supply openings 31a, 31b, 33a, 33b (see FIG. 1) are arranged so as to blow air conditioning in a direction parallel with each of the interferometer light paths 11a, 11b, 11d, 11e in FIG. 1. On the other hand, according to the present exemplary embodiment, the air conditioning supply openings are arranged so as to blow the air conditioning in a direction perpendicular to each of the interferometer light paths 11a, 11b, 11c, 11d, 11e, 11f of the interferometric length measuring devices 13a, 13b, 13e, 13c, 13d, 13f. More specifically, the air conditioning is blown in a Z direction of FIG. 9 to perform air conditioning of the space around each interferometer light paths 11a, 11b, 11c, 11d, 11e and 11f.

Now, for the sake of description, each of the air conditioning supply openings 21a, 21b, 21c, 23a, 23b, 23c, 25a, 25b, 25c, 27a, 27b and 27c will be classified and defined as follows. The air conditioning supply openings for the air conditioning of the interferometer light paths 11a, 11b and 11c in the exposure operation region are defined as air conditionings A, and the other air conditioning supply openings for the air conditioning in the exposure operation region will be defined as air conditionings B. Further, the air conditioning supply openings for the air conditioning of the interferometer light paths 11d, 11e and 11f in the measurement operation region will be defined as air conditionings C, and the other air conditioning supply openings for the air conditioning in the measurement operation region will be defined as air conditionings D.

Similar to the first exemplary embodiment, the flow rate adjusting device 55 determines a flow rate to each of the air conditioning supply openings (air conditionings A, air conditionings B, air conditionings C, air conditionings D) based on an output of the exposure process control device 59 to adjust the flow rate. A method of determining the flow rate will be described below.

Figure 10:
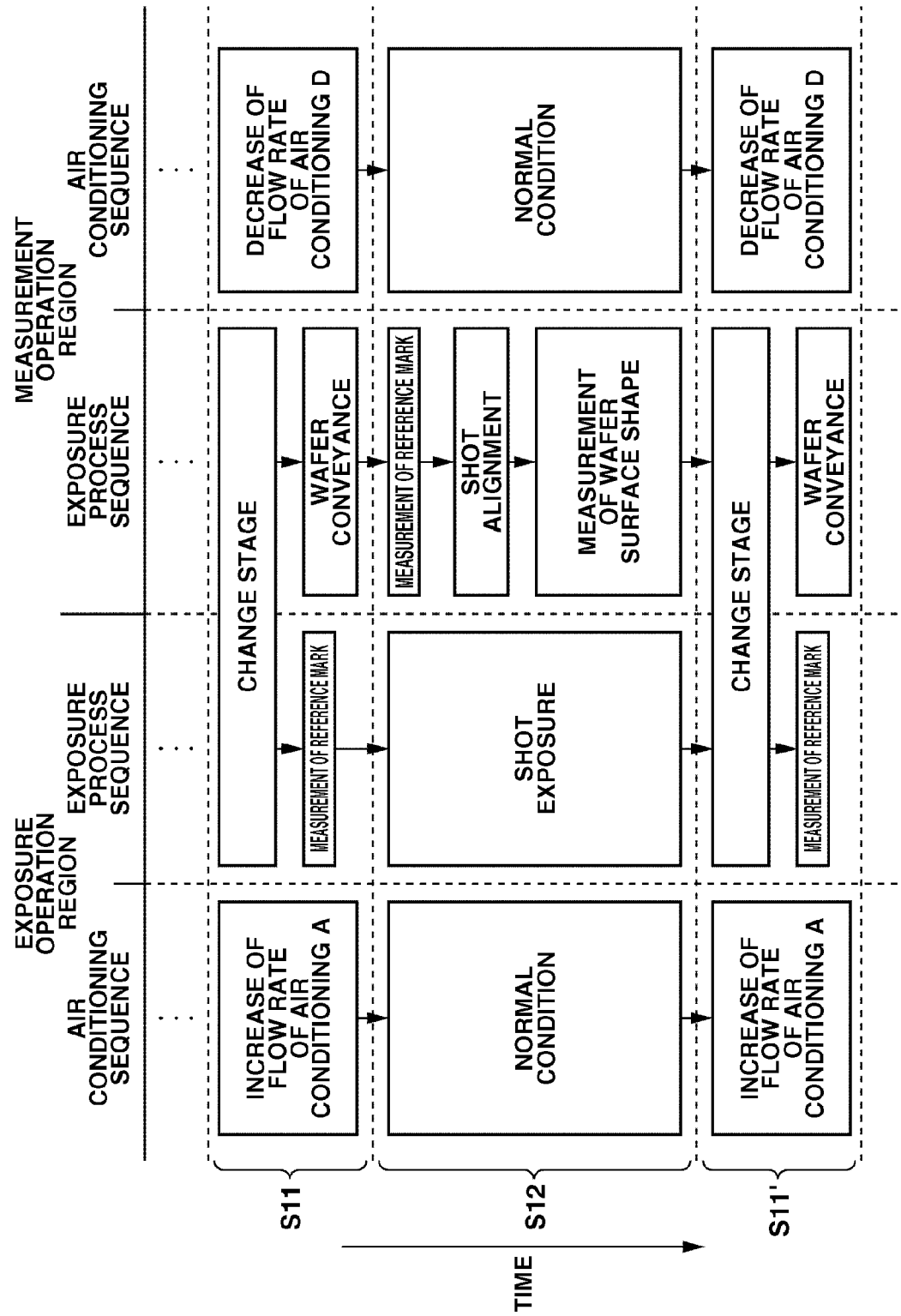
FIG. 10 illustrates a time-sequential relationship between an exposure process and an adjustment condition of an air conditioning according to the second exemplary embodiment of the invention.

FIG. 10 illustrates a time-sequential relationship between the exposure process state and the air conditioning state according to the present exemplary embodiment in a similar manner to FIG. 2.

Initially, time step S11 defines a step from a start of the stage exchange process to an end of the reference mark measurement process in the exposure operation region. In time step S11, the air conditioning in a neighborhood of the interferometer light path in the exposure operation region is deteriorated due to the stage exchange process, as described in the first exemplary embodiment, and further the next exposure process requires a high accuracy air conditioning. Therefore, an air conditioning adjustment is desirable that can rapidly readjust the deteriorated air conditioning accuracy. On the other hand, in the measurement operation region, even if the air conditioning accuracy may be deteriorated in some degree, a wafer conveyance process will be performed which does not have an effect on the exposure accuracy. However, since the reference mark measurement process follows after the wafer conveyance process, it is required to readjust the air conditioning to a high accuracy at least around the interferometer light paths 11d, 11e and 11f during the wafer conveyance process. In consideration of the above, in the present exemplary embodiment, the flow rate adjusting device 55 decreases in time step S11 the flow rate of the air conditionings D which has the lowest air conditioning priority, while it increases the flow rate of the air conditionings A which has the highest air conditioning priority. The other air conditioning openings (air conditionings B, air conditionings C) are kept in normal condition.

In time step S12, an exposure process which requires a high accuracy air conditioning is performed in both of the exposure operation region and the measurement operation region. Therefore, the air conditioning of all the air conditioning supply openings requires a high accuracy, and thus the flow rate adjusting device 55 adjusts the air conditioning to the normal condition so as to keep all the supply openings at a uniform accuracy.

In time step S11', the flow rate adjusting device 55 increases the flow rate of the air conditionings A, while it decreases the flow rate of the air conditionings D similar to time step S11. In the exposure apparatus according to the present exemplary embodiment, the processing basically repeats time step S11 and time step S12. Therefore, the adjustment of the air conditioning is also repeated according to a sequence of the exposure process.

As described in the present exemplary embodiment, the air conditioning of the interferometer light path is given a priority in consideration of the characteristics of the exposure process and preceding and subsequent exposure processes while decreasing a priority of the other air conditioning to achieve an air conditioning balance. Accordingly, the exposure accuracy can be increased while utilizing the air conditioning function efficiently.

In the present exemplary embodiment, no example of the specific assessment function is described; however, it is basically possible to use the assessment function and the coefficient similar to the first exemplary embodiment. That is, the assessment function according to the first exemplary embodiment can be set for each of the air conditioning supply openings (A, B, C, D). In that case, a suitable weighting factor is newly introduced such that an air conditioning coefficient of the air conditioning supply openings (A and C) for air conditioning of the interferometer light path becomes relatively large, while the air conditioning coefficient of the air conditioning supply openings (B and D) for the other spaces becomes relatively small. Accordingly, in the exposure process that places more emphasis on the air conditioning, the air conditioning coefficient of the air conditioning supply openings for the air conditioning in the neighborhood of the interferometer light path becomes relatively large, and thus the gas flow rate will be increased. To the contrary, in the exposure process that does not place much emphasis on the air conditioning, the air conditioning coefficient of the air conditioning supply openings for the space other than the interferometer light path becomes relatively small, and thus the gas flow rate will be decreased. It is useful that the assessment function capable of performing the above air conditioning adjustment is prepared.

Third Exemplary Embodiment

Now, a third exemplary embodiment of the present invention will be described with reference to FIGS. 9 and 11. A configuration of the exposure apparatus according to the present exemplary embodiment has a configuration of FIG. 9 the same as the second exemplary embodiment. However, an idea of the air conditioning optimization is further developed and a sequence of the air conditioning adjustment corresponding to the exposure process is slightly different.

Figure 11:
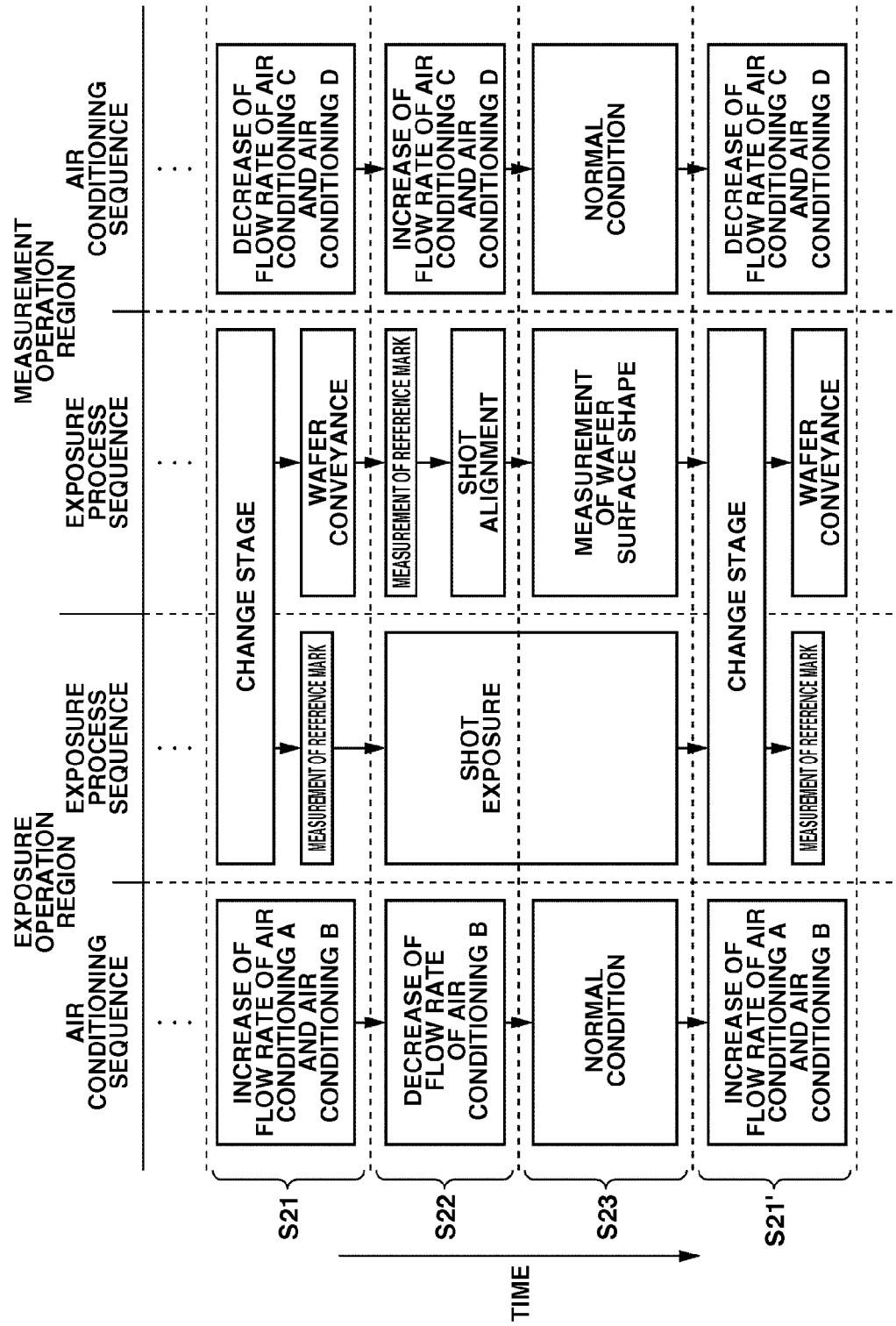
FIG. 11 illustrates a time-sequential relationship between an exposure process and an adjustment condition of an air conditioning according to the third exemplary embodiment of the present invention.

FIG. 11 defines the time step as follows similar to the other exemplary embodiments. That is, the time step from a start of the stage exchange process to an end of the reference mark measurement process in the exposure operation region is defined as time step S21, and the time step after the end of the reference mark measurement process to an end of the shot alignment process in the measurement operation region is defined as time step S22. Further, the time step from an end of the shot alignment process to immediately before the next stage exchange process starts is defined as time step S21'. A relationship between the exposure process and the adjustment condition of the air conditioning in every time step will be described below.

In time step S21, the flow rate adjusting device 55 places higher priority on the air conditioning (air conditionings A and air conditionings B) of the exposure operation region than the air condition (air conditionings C and air conditionings D) of the measurement operation based on the idea of the air conditioning optimization as described in the first exemplary embodiment. In other words, the flow rate adjusting device 55 increases the gas flow rate of the air conditionings A and the air conditionings B, while it decreases the flow rate of the air conditionings C and the air conditionings D.

In time step S22, the exposure processes requiring a high accuracy air conditioning are performed in both of the exposure operation region and the measurement operation region, and a priority of the air conditioning is determined considering the following points. That is, since the shot exposure process relatively does not have a large movement stroke, no appreciable deterioration of the air conditioning would be caused in this process. In other words, if at least the air conditioning of the interferometer light paths (11a, 11b and 11c) in the exposure operation region is highly accurate, much effect on the air conditioning will not be observed. On the other hand, the shot alignment process has a large movement stroke of the stage, and therefore, it tends to disturb the air conditioning. Therefore, it is desirable that not only the air conditioning around the interferometer light paths (11d, 11e and 11f) of the measurement operation region but also the air conditioning far and wide around the interferometer light paths has a high accuracy air conditioning state. In consideration of the above, the flow rate adjusting device 55 places higher priority on the air conditionings C and the air conditionings D, while it places lower priority on the air conditioning B. The air conditionings A are adjusted to a normal condition in order to perform a high accuracy shot exposure process.

In time step S23, the shot exposure process and the wafer surface shape measurement process are performed. Since both processes have similar characteristics, similar air conditionings are desirable in the two regions. Therefore, the flow rate adjusting device 55 readjusts the air conditioning to the normal condition.

The time step S21' has a similar sequence to the time step S21. After that, the air conditioning adjustment is repeated corresponding to the exposure process while the exposure process repeats time steps S21-S23.

Fourth Exemplary Embodiment

Now, a fourth exemplary embodiment will be described below with reference to FIGS. 9 and 12. In the present exemplary embodiment, the exposure apparatus has the configuration of FIG. 9 similar to the second exemplary embodiment. However, since an idea of the optimization of the air conditioning is changed, the sequence of the air conditioning adjustment corresponding to the exposure process slightly differs from that according to the second exemplary embodiment.

Figure 12:
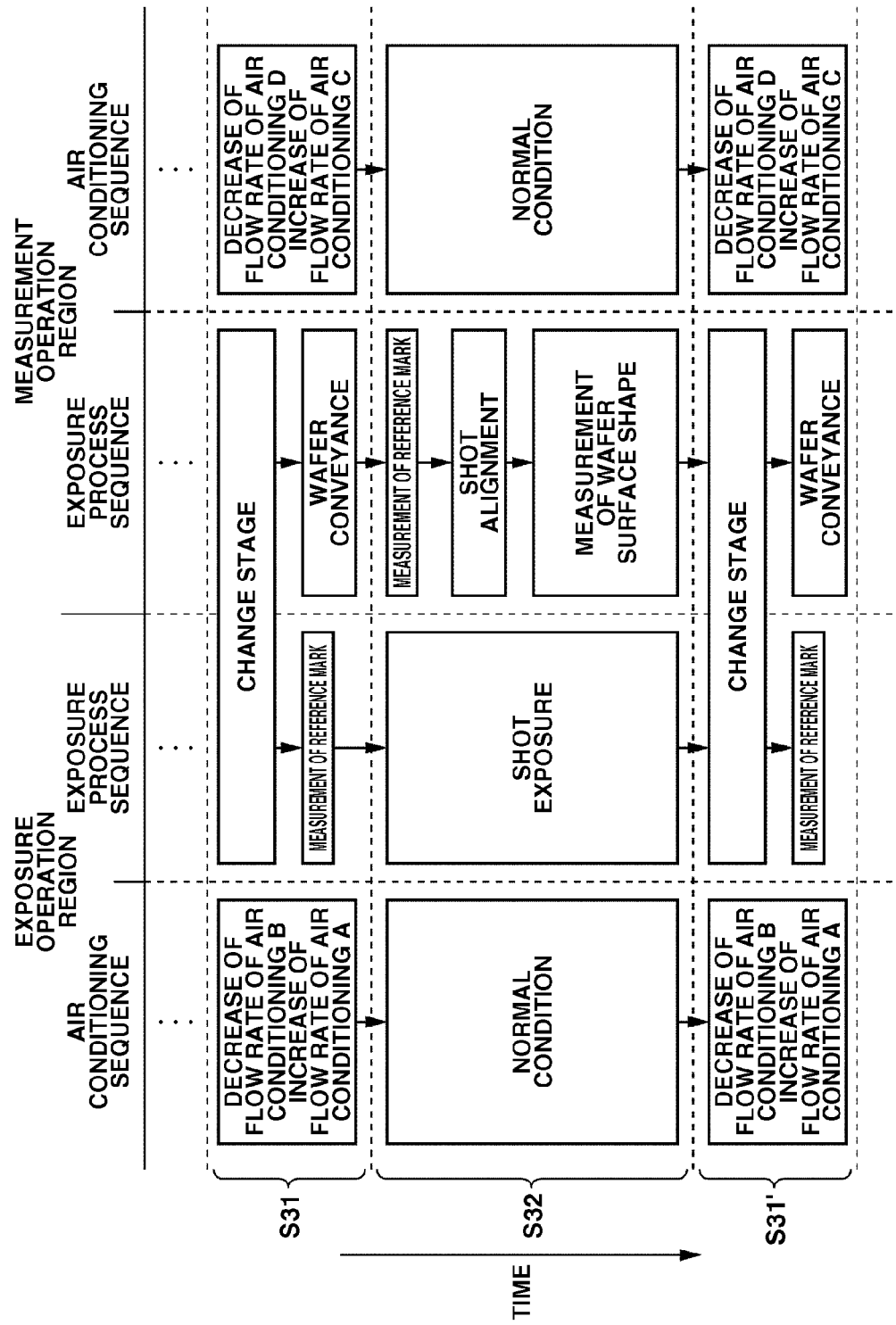
FIG. 12 illustrates a time-sequential relationship between an exposure process and an adjustment condition of an air conditioning according to the fourth exemplary embodiment of the present invention.

FIG. 12 defines time step as follows similar to the other exemplary embodiments. That is, the time step from a start of the stage exchange process to an end of the reference mark measurement process in the exposure operation region is referred to as time step S31, and the time step from the end of the reference mark measurement process to immediately before the next stage exchange process starts is referred to as time step S32. Then, time step S31 and time step S32 are repeated similar to the other exemplary embodiments. For the convenience sake, the time step next to S32 which corresponds to S31 is referred to as S31'. Hereinafter, a relationship between the exposure process and the adjustment condition of an air conditioning in each time step according to the present exemplary embodiment will be described.

The present exemplary embodiment illustrates an example of the time step for performing the exposure process entailing the air conditioning deterioration based on an idea that a priority is given to a recovery of the air conditioning accuracy around the interferometer light paths 11a-11f. In time step S31, the flow rate adjusting device 55 increases the flow rate of the air conditioning (air conditionings A and air conditionings C) of the interferometer light paths 11a-11f during the stage exchange process entailing the air conditioning deterioration and for a while after the stage exchange process, while it decreases the flow rate of the other air conditioning (air conditionings B and air conditionings D). Accordingly, at least in the vicinity of the interferometer light paths 11a-11f, an effect of the air conditioning deterioration can be swiftly removed.

In time step S32, a high accuracy air conditioning is required for the exposure processes in both of the regions, and the air conditioning adjustment is not desired during the shot exposure process. Accordingly, the air conditioning is adjusted to the normal air conditioning state.

Time step S31' is similar to time step S31. Hereinafter, while the exposure process repeats time steps S21-S23, the air conditioning adjustment is repeated corresponding to the exposure processes.

According to the exemplary embodiment of the present invention, it is possible to optimize the air conditioning by combining the above described exemplary embodiment.

Further, the exposure process varies and the order of the processes varies according to a system of the exposure apparatus and merely examples are described in the exemplary embodiments. However, the present invention is applicable to any exposure process if the characteristics of the exposure processes and the preceding and the subsequent exposure processes are considered.

It is not sufficient to specify a timing when the air conditioning is to be carried out only based on a condition of the stage because the air conditioning accuracy required for every exposure process, a degree of air conditioning deterioration according to the operation of the stage, and a relationship between preceding and the subsequent exposure processes are different in each case. The second, the third, and the fourth exemplary embodiments optimize the air conditioning in consideration of the characteristics of the exposure processes and the relationship between the preceding and the subsequent exposure processes so that more stable and efficient air conditioning can be achieved.

Fifth Exemplary Embodiment

In the above exemplary embodiments, the adjustment of the gas flow rate based on the information of the exposure process has been described. A fifth exemplary embodiment of the present invention can adjust the gas flow rate based on the information as to the operation of the stage. That is, information as to a positional accuracy required in performing each operation of the stages and information as to a degree of an effect of the movements of the stages on the air conditioning are preliminary acquired. Information corresponding to the movement of the stage at every second is calculated according to the assessment function, and the flow rate of each air conditioning supply opening is changed according to the above calculation result so that an air conditioning effect in the entire exposure apparatus can be improved. Further, not only the information about the operation of the stage at every moment but also information about an expected operation of the stage is acquired and incorporated into the assessment function for evaluation to adjust the air conditioning.

For example, a coefficient table equivalent to those of FIGS. 4 and 5 is prepared per stage operation and the assessment function equivalent to the above stated assessment function is calculated per stage operation. Namely, the coefficient table equivalent to FIG. 4 is prepared by replacing the "exposure process" with the "stage operation". Further, a table corresponding to that of FIG. 5 may be prepared by replacing the "exposure process" in FIG. 5 with the "stage operation", and calculating a coefficient for each of the stage operation, for example, at an interval of five seconds during a series of the stage operation.

Figure 14:
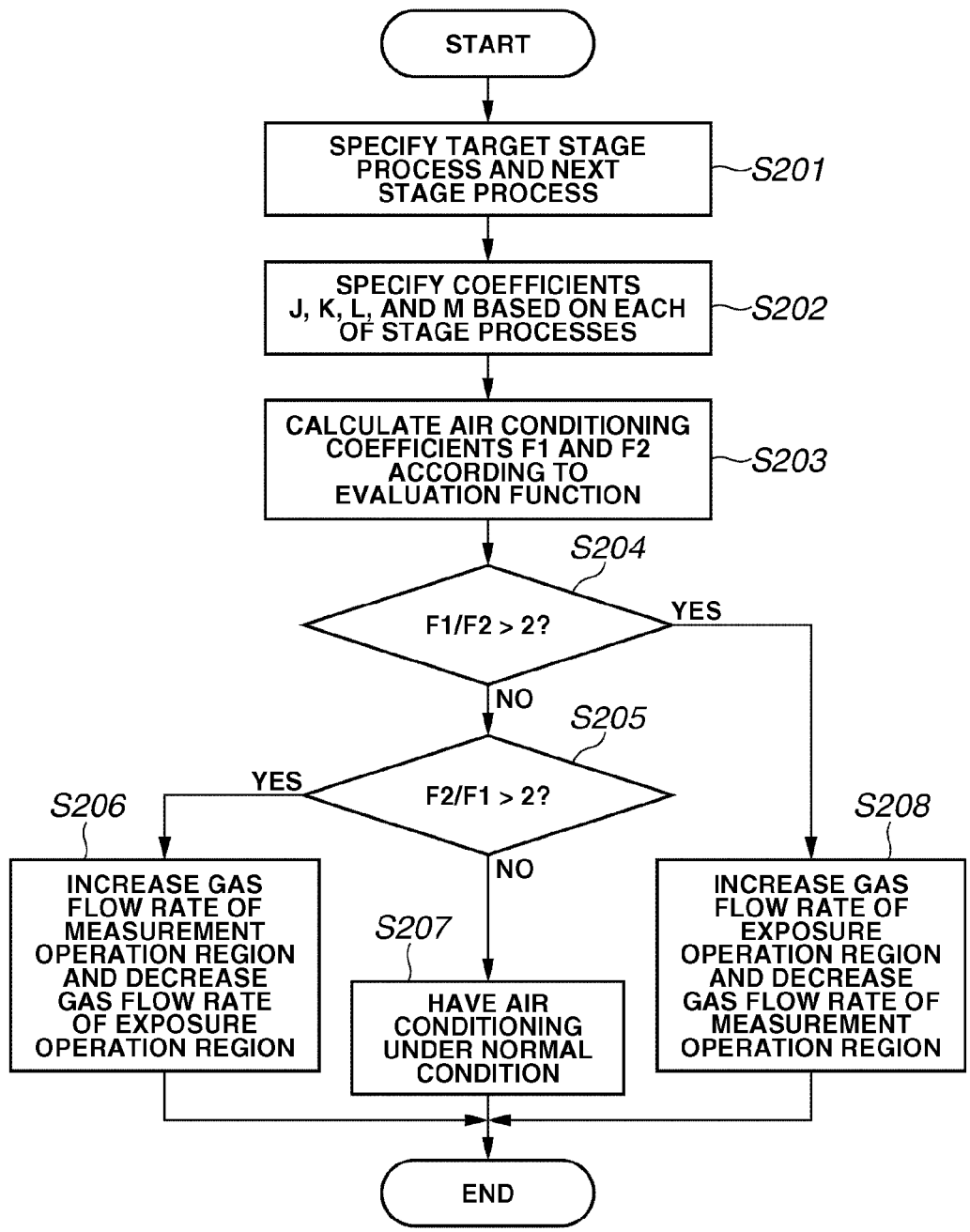
FIG. 14 is a flow chart illustrating an air conditioning adjustment according to the fifth exemplary embodiment of the present invention.

FIG. 14 illustrates a flow of air conditioning control according to the fifth exemplary embodiment of the present invention. The flow rate adjusting device 55 specifies a target exposure process and the next exposure process in step S201. The flow rate adjusting device 55 specifies coefficients J, K, L, M based on the exposure processes, respectively, in step S202. The flow rate adjusting device 55 calculates the air conditioning coefficients F1 and F2 by the assessment function in step S203. The flow rate adjusting device 55 determines whether the calculated air conditioning coefficients F1 and F2 satisfy a predetermined relationship in steps S204 and S205. Then, the flow rate adjusting device 55 adjusts the air conditioning gas flow rate in a following manner based on the result. The flow rate adjusting device 55 increases the air conditioning gas flow rate in the measurement operation region, while it decreases the air conditioning gas flow rate in the exposure operation region in step S206. The flow rate adjusting device 55 places the air conditioning gas flow rate of both regions in the normal condition in step S207. The flow rate adjusting device 55 increases the air conditioning gas flow rate in the exposure operation region, while it decreases the air conditioning gas flow rate in the exposure operation region in step S208.

It can be seen that the air conditioning control is performed per exposure process in the first to the fourth exemplary embodiments, while the air conditioning control is performed per optionally defined stage operation in the fifth exemplary embodiment. There are various ways of defining the stage operation. For example, the stage operation can be divided per 1 sec. or the stage operation can be divided at a time when the stage is moved from a certain positional region to the other positional region. Alternatively, the stage operation can be divided in each exposure process. In such a case, an effect almost the same as that produced by the first to the fourth exemplary embodiments can be expected.

Figure 13:
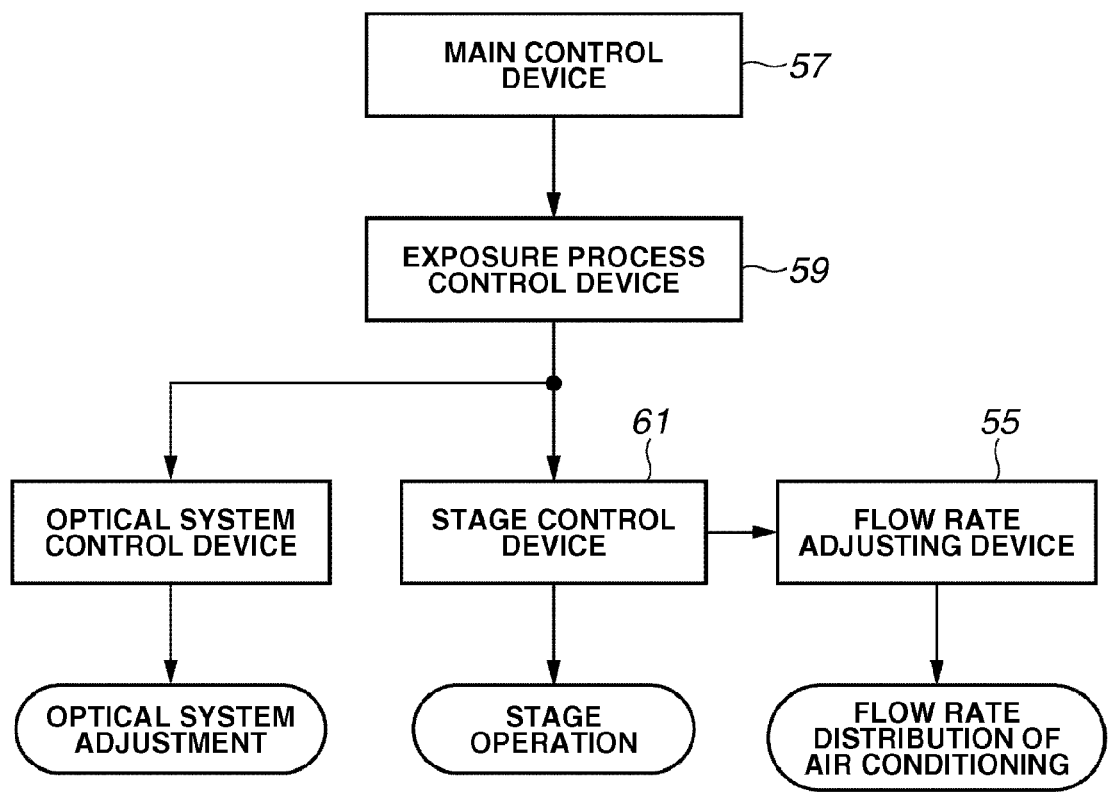
FIG. 13 illustrates how a main control device and each of controllers are connected through information according to the fifth embodiment of the present invention.

As described above, although it depends on the definition of the stage operation, typically, the air conditioning can be optimized at intervals shorter than an exposure process. In this case, a timing for changing the gas flow rate is not always set to a transition point between the exposure processes. In other words, the fifth exemplary embodiment is suitable to adjust the air conditioning in real time regardless the exposure process. FIG. 13 illustrates a flow the information. As shown in FIG. 13, information as to the stage is transmitted from the stage control device 61 downstream from the exposure process control device 59, and the flow rate adjusting device 55 adjusts the air conditioning based on thus transmitted information according to the present exemplary embodiment. Therefore, information such as a timing at which the exposure process is switched over cannot be acquired; however, more information as to the stage operation can be acquired. Consequently, for example, in a case where a stage operation having a larger stroke and thus higher movement speed and a stage operation having smaller stroke and lower movement speed are mixed in the exposure process, the air conditioning adjustment can be performed more flexibly than the air conditioning adjustment performed per exposure process.

As a matter of course, the above configuration may further include a system for transmitting from the exposure process control device 59 additional information such as timing at which the exposure process is switched over, and the assessment function additionally incorporating the above information is applicable. For example, a stable positioning accuracy may be desirable during the shot exposure process or the like. In such a case, a change of the air conditioning is desirably suppressed during the exposure process. In order to respond to the above-described circumstances, it is advantageous to acquire separately the timing information at which the exposure process is switched over.

That is, a combination of the first to the fourth exemplary embodiments and the fifth exemplary embodiments can also be realized. In such a case, an advantageous effect almost equivalent to that produced by the first to the fourth exemplary embodiments can be produced.

According to the present exemplary embodiments, the air conditioning control is performed using the movement information of the stage (stroke and speed) and information about the required positioning accuracy.

The operation information of the stage relates to a degree of effect on the air conditioning, and is used for calculating an index showing a degree of the generated air temperature around the interferometer light path. As to the degree of the effect on the air conditioning, it is desirable that not only the degree of effect at a certain moment but also the degree of effect based on the time until the disturbed air conditioning returns to the original adjusted air conditioning. Further, it is desirable that the positioning accuracy required in the next operation is also acquired for evaluation by the assessment function based on the above described information. That is, more desirable air conditioning can be realized if the effect of the subsequent movement of the stage is considered in addition to the target movement of the stage.

A device (semiconductor integrated circuit element, liquid display element, and the like) is manufactured through a process of exposing a substrate (wafer, glass substrate, or the like) coated with a photosensitive material; a process of developing the substrate; and a process of the other known step using the exposure apparatus as described in one of the exemplary embodiments of the present invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-155376 filed Jun. 12, 2007, which is hereby incorporated by reference herein in its entirety.

What is claimed is:

1. An exposure apparatus comprising:
a projection optical system configured to project a pattern of an original plate onto a substrate;
a measurement optical system configured to measure a position or a surface shape of the substrate;
a plurality of moving members configured to hold the substrate;
a first region on which one of the moving members moves for projecting the pattern of the original plate onto the substrate by the projection optical system;
a second region on which one of the moving members moves for measuring the position or the surface shape of the substrate by the measurement optical system;
a first interferometer configured to measure a position of the moving member positioned in the optical path of the projection optical system;
a second interferometer configured to measure a position of the moving member positioned in an optical path of the measurement optical system;
a blower device for blowing temperature-adjusted gas;
a first supply opening communicating with the blower device, configured to provide air conditioning to a light path of measurement light illuminating the moving member from the first interferometer;
a second supply opening communicating with the blower device, configured to provide air conditioning to a light path of measurement light illuminating the moving member from the second interferometer;
a flow rate adjusting device configured to adjust a flow rate and supply gas blown from the blower device to each of the first supply opening and the second supply opening based on an operation of the moving member; and
a comparison unit configured to compare an operation of the moving member positioned in the first region and an operation of the moving member positioned in the second region among the plurality of moving members,
wherein the flow rate adjusting device adjusts a flow rate based on the comparison result of the comparison unit.

2. An exposure apparatus comprising:
a projection optical system configured to project a pattern of an original plate onto a substrate;
a measurement optical system configured to measure a position or a surface shape of the substrate;
a moving member configured to hold the substrate;
a first interferometer configured to measure a position of the moving member positioned in the optical path of the projection optical system;
a second interferometer configured to measure a position of the moving member positioned in an optical path of the measurement optical system;
a blower device for blowing temperature-adjusted gas;
a first supply opening communicating with the blower device, configured to provide air conditioning to a light path of measurement light illuminating the moving member from the first interferometer;
a second supply opening communicating with the blower device, configured to provide air conditioning to a light path of measurement light illuminating the moving member from the second interferometer;
a flow rate adjusting device configured to adjust a flow rate and supply gas blown from the blower device to each of the first supply opening and the second supply opening based on an operation of the moving member; and
a memory holding unit configured to preliminarily store information as to a flow rate required for each operation of the moving member,
wherein the flow rate adjusting device increases a gas flow rate through the supply opening for providing air conditioning to a region where an operation of the moving member requiring a larger flow rate is performed, while it decreases the gas flow rate through the other supply opening, with respect to the first supply opening and the second supply opening based on the information.

3. The exposure apparatus according to claim 2, wherein the information as to the flow rate includes at least one of information as to an air conditioning accuracy required by each operation of the moving member, a disturbance of the air conditioning caused by each operation, and an order of each operation, or information calculated by using at least one of the above information.

4. The exposure apparatus according to claim 3, wherein the operation of the moving member is set corresponding to the exposure process.

5. An exposure apparatus comprising:
a projection optical system configured to project a pattern of an original plate onto a substrate;
a measurement optical system configured to measure a position or a surface shape of the substrate;
a moving member configured to hold the substrate;
a first interferometer configured to measure a position of the moving member positioned in the optical path of the projection optical system;
a second interferometer configured to measure a position of the moving member positioned in an optical path of the measurement optical system;
a blower device for blowing temperature-adjusted gas;
a first supply opening communicating with the blower device, configured to provide air conditioning to a light path of measurement light illuminating the moving member from the first interferometer;

a second supply opening communicating with the blower device, configured to provide air conditioning to a light path of measurement light illuminating the moving member from the second interferometer;

a flow rate adjusting device configured to adjust a flow rate and supply gas blown from the blower device to each of the first supply opening and the second supply opening based on an operation of the moving member; and a memory holding unit configured to preliminarily store information as to a flow rate required for each operation of the moving member, wherein the flow rate adjusting device increases a gas flow rate through the supply opening for providing air conditioning to a region where the next operation of the moving member requiring a larger flow rate is performed, while it decreases a gas flow rate through the other supply opening, with respect to the first supply opening and the second supply opening.

6. The exposure apparatus according to claim 5, wherein the information as to the flow rate includes at least one of information as to an air conditioning accuracy required in each operation of the moving member, a disturbance of the air conditioning caused by each operation, and an order of each operation, or information calculated by using at least one of the information.

7. The exposure apparatus according to claim 6, wherein the operation of the moving member is set corresponding to the exposure process.

8. An exposure apparatus comprising:

a projection optical system configured to project a pattern of an original plate onto a substrate;

a measurement optical system configured to measure a position or a surface shape of the substrate;

a plurality of moving members configured to hold the substrate;

a first region on which one of the moving members moves for projecting the pattern of the original plate onto the substrate by the projection optical system;

a second region on which one of the moving members moves for measuring the position or the surface shape of the substrate by the measurement optical system;

a first interferometer configured to measure a position of the moving member positioned in the optical path of the projection optical system;

a second interferometer configured to measure a position of the moving member positioned in an optical path of the measurement optical system;

a blower device for blowing temperature-adjusted gas;

a first supply opening communicating with the blower device, configured to provide air conditioning to a light path of measurement light illuminating the moving member from the first interferometer;

a second supply opening communicating with the blower device, configured to provide air conditioning to a light path of measurement light illuminating the moving member from the second interferometer;

a flow rate adjusting device configured to adjust a flow rate and supply gas blown from the blower device to each of the first supply opening and the second supply opening based on an operation of the moving member; and a storage device configured to store information as to a flow rate required for each operation of the plurality of moving members, and an order of the operations of the plurality of moving members performed in the first region and the second region, wherein the flow rate adjusting device adjusts a flow rate based on the information as to the flow rate and the order of the operations of the plurality of moving members.

9. The exposure apparatus according to claim 8, wherein the information as to the flow rate includes at least one of the information of an air conditioning accuracy required in each operation of the plurality of moving members, a disturbance of the air conditioning caused by each operation, and an order of each operation, or information calculated by using at least one of the information.

10. The exposure apparatus according to claim 9, wherein operations of the plurality of moving members are set corresponding to the exposure process.

* * * * *